(12) United States Patent
Kim et al.

(10) Patent No.: US 9,608,028 B2
(45) Date of Patent: Mar. 28, 2017

(54) IMAGE SENSOR AND METHOD FOR MANUFACTURING SAME

(71) Applicants: Rayence Co., Ltd., Gyeonggi-do (KR); Vatech Ewoo Holdings Co., Ltd., Gyeonggi-do (KR)

(72) Inventors: Tae Woo Kim, Gyeonggi-do (KR); Dong Jin Lee, Gyeonggi-do (KR)

(73) Assignees: Rayence Co., Ltd., Gyeonggi-do (KR); VATECH EWOO Holdings Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/903,700

(22) PCT Filed: Jul. 8, 2014

(86) PCT No.: PCT/KR2014/006129
§ 371 (c)(1),
(2) Date: Jan. 8, 2016

(87) PCT Pub. No.: WO2015/005660
PCT Pub. Date: Jan. 15, 2015

(65) Prior Publication Data
US 2016/0172415 A1 Jun. 16, 2016

(30) Foreign Application Priority Data

Jul. 8, 2013 (KR) .................... 10-2013-0079623

(51) Int. Cl.
*H01L 27/146* (2006.01)
*H01L 31/0264* (2006.01)
(Continued)

(52) U.S. Cl.
CPC .. *H01L 27/14676* (2013.01); *H01L 27/14601* (2013.01); *H01L 27/14636* (2013.01);
(Continued)

(58) Field of Classification Search
CPC ......... H01L 27/14676; H01L 27/14636; H01L 27/14683; H01L 27/14696; H01L 31/0336; H01L 31/0224; H01L 31/0296
(Continued)

(56) References Cited

U.S. PATENT DOCUMENTS

2001/0020683 A1   9/2001   Teranuma et al.
2005/0161754 A1   7/2005   Izumi
(Continued)

FOREIGN PATENT DOCUMENTS

JP         4364553 B2        11/2009
KR    10-2001-0089211 A       9/2001
KR    10-2008-0108897 A      12/2008

*Primary Examiner* — Dao H Nguyen
(74) *Attorney, Agent, or Firm* — IP Legal Services, LLC

(57) ABSTRACT

Disclosed is an image sensor, which is characterized by increased strength of adhesion between a photoconductive layer and a front electrode made of aluminum, and which includes a first electrode composed of aluminum, copper or an aluminum-copper alloy on a substrate, a buffer layer formed on the first electrode, a photoconductive layer formed on the buffer layer, and a second electrode formed on the photoconductive layer, wherein the buffer layer includes a material having higher strength of adhesion than the photoconductive layer to the first electrode.

10 Claims, 3 Drawing Sheets

(51) Int. Cl.
*H01L 31/0296* (2006.01)
*H01L 31/0224* (2006.01)
*H01L 31/0336* (2006.01)

(52) U.S. Cl.
CPC .. *H01L 27/14658* (2013.01); *H01L 27/14683* (2013.01); *H01L 27/14696* (2013.01); *H01L 31/0224* (2013.01); *H01L 31/0296* (2013.01); *H01L 31/0336* (2013.01)

(58) Field of Classification Search
USPC .......... 257/53, 200, 290, 428, 432, E21.068, 257/E21.09, E27.147, E31.007, E31.008; 438/67, 84, 94, 98
See application file for complete search history.

(56) References Cited

U.S. PATENT DOCUMENTS

| | | | |
|---|---|---|---|
| 2008/0303022 A1 | 12/2008 | Tai et al. | |
| 2010/0186816 A1* | 7/2010 | Park | H01L 31/022425 136/256 |
| 2011/0061737 A1* | 3/2011 | Hotz | H01L 31/022425 136/260 |
| 2013/0240039 A1* | 9/2013 | Park | H01L 31/0322 136/262 |
| 2014/0124020 A1* | 5/2014 | Garnett | H01L 31/02966 136/255 |
| 2015/0221790 A1* | 8/2015 | Heben | H01L 31/02167 136/255 |

* cited by examiner

200

IMAGE SENSOR AND METHOD FOR MANUFACTURING SAME

CROSS REFERENCE TO RELATED APPLICATIONS

This application is a National Stage Patent Application of PCT International Patent Application No. PCT/KR2014/006129 (filed on Jul. 8, 2014) under 35 U.S.C. §371, which claims priority to Korean Patent Application No. 10-2013-0079623 (filed on Jul. 8, 2013), the teachings of which are incorporated herein in their entireties by reference.

TECHNICAL FIELD

The present invention relates to an image sensor and, more particularly, to an image sensor in which the strength of adhesion of a photoconductive layer to a front electrode is improved, and a method of manufacturing the same.

BACKGROUND ART

Conventionally, X-rays for medical or industrial applications have been typically taken using films and screens. In this case, the use of resources and time becomes inefficient due to problems related to the development and storage of the taken films.

Hence, digital-type image sensors are currently widely used.

Such image sensors are classified into indirect conversion-type image sensors and direct conversion-type image sensors. Indirect conversion-type image sensors function such that X-rays are converted into visible light using a scintillator, after which the visible light is converted into an electrical signal. By comparison, direct conversion-type image sensors function such that X-rays are directly converted into an electrical signal using a photoconductive layer. Direct conversion-type image sensors are suitable for use in high-resolution systems because there is no need for an additional scintillator and the spreading of light does not occur.

The photoconductive layer used in the direct conversion-type image sensor is formed using a variety of materials. Recently, the photoconductive layer has been made from a semiconductor material having high atomic weight, such as CdTe, CdZnTe, PbO, $PbI_2$, $HgI_2$, GaAs, Se, TlBr, and $BiI_3$. However, such a photoconductive layer exhibits poor adhesion to aluminum or copper (Cu), which may be used in a front electrode, undesirably causing the photoconductive layer to come loose.

DISCLOSURE

Technical Problem

Accordingly, an object of the present invention is to provide a way to increase the strength of adhesion between a photoconductive layer and a front electrode made of aluminum.

Technical Solution

In order to accomplish the above object, an aspect of the present invention provides an image sensor, comprising: a first electrode comprising aluminum, copper or an aluminum-copper alloy on a substrate; a buffer layer formed on the first electrode; a photoconductive layer formed on the buffer layer; and a second electrode formed on the photoconductive layer, wherein the buffer layer comprises a material having higher strength of adhesion than the photoconductive layer to the first electrode.

The buffer layer may comprise CdS or ZnTe, and the photoconductive layer may comprise CdTe, CdZnTe, PbO, $PbI_2$, $HgI_2$, GaAs, Se, TlBr or $BiI_3$. The buffer layer may have a thickness of 1 to 5 μm. The buffer layer may be formed on at least a portion of a plurality of pixel regions for the image sensor. The image sensor may be an image sensor for detecting X-rays.

Another aspect of the present invention provides a method of manufacturing an image sensor, comprising: forming a first electrode comprising aluminum, copper or an aluminum-copper alloy on a substrate; forming a buffer layer on the first electrode; forming a photoconductive layer on the buffer layer; and forming a second electrode on the photoconductive layer, wherein the buffer layer comprises a material having higher strength of adhesion than the photoconductive layer to the first electrode.

The buffer layer may comprise CdS or ZnTe, and the photoconductive layer may comprise CdTe, CdZnTe, PbO, $PbI_2$, $HgI_2$, GaAs, Se, TlBr or $BiI_3$. The buffer layer may have a thickness of 1 to 5 μm. The buffer layer may be formed on at least a portion of a plurality of pixel regions for the image sensor. The image sensor may be an image sensor for detecting X-rays.

Advantageous Effects

According to the present invention, an image sensor is configured such that a buffer layer having high strength of adhesion to a front electrode, compared to a photoconductive layer, is provided between the photoconductive layer and the front electrode, which is made of aluminum. Thus, the strength of adhesion of the photoconductive layer to the front electrode can be increased.

MODE FOR INVENTION

Hereinafter, a detailed description will be given of embodiments of the present invention, with reference to the appended drawings.

Figure 1:
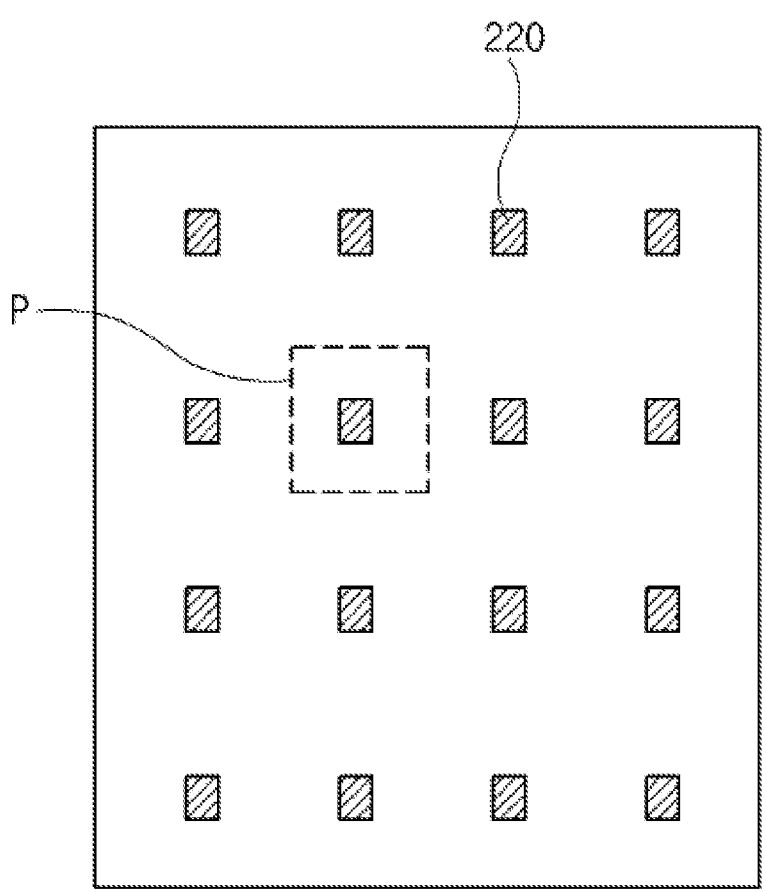
FIGS. 1 and 2 are, respectively, a top plan view and a cross-sectional view schematically illustrating an image sensor according to an embodiment of the present invention.
Figure 2:
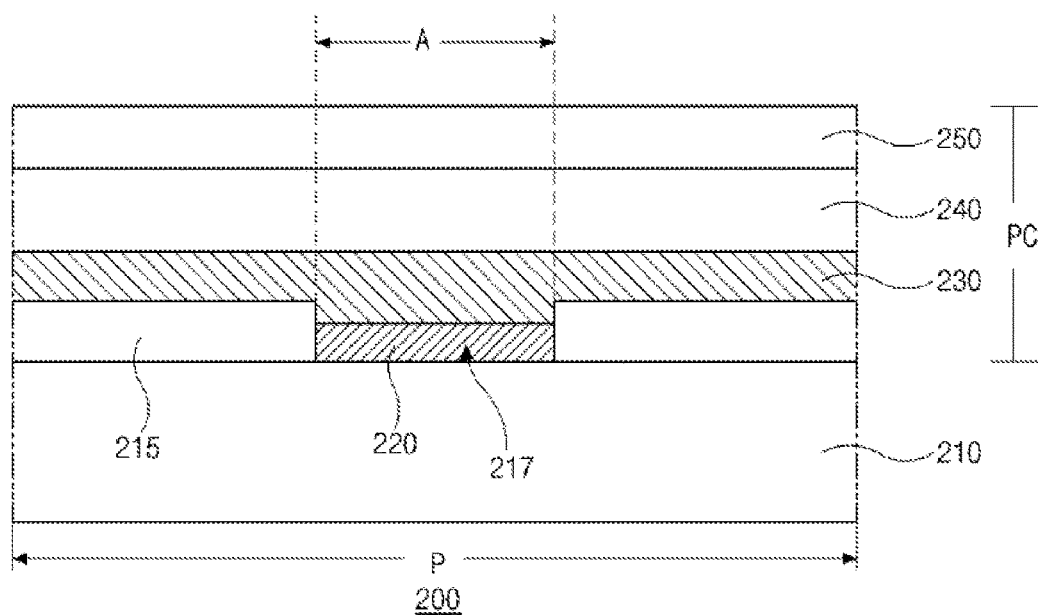
Figure 3:
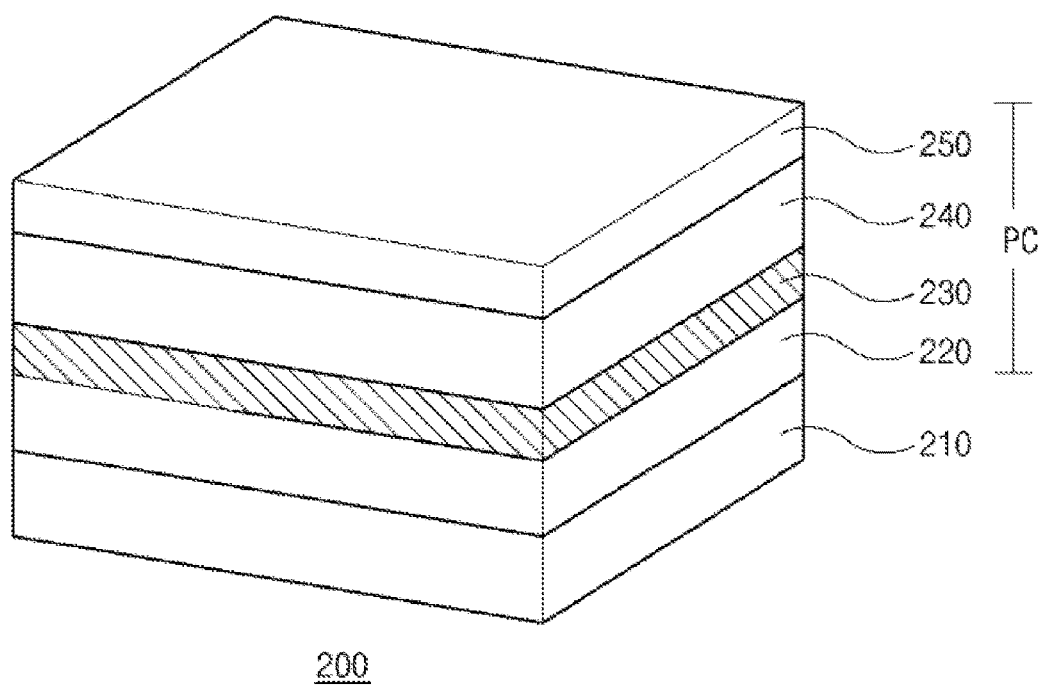
FIG. 3 is a perspective view illustrating region A in FIG. 2.

FIGS. 1 and 2 are, respectively, a top plan view and a cross-sectional view schematically illustrating an image sensor according to an embodiment of the present invention, and FIG. 3 is a perspective view illustrating region A in FIG. 2.

According to an embodiment of the present invention, an image sensor 200 may be employed in a variety of X-ray imaging devices having various shapes or end uses. Examples of such X-ray imaging devices may include mammographic devices, CT devices, etc.

The image sensor 200 is configured such that X-rays that pass through an objective are detected and then converted into an electrical signal. The image sensor 200 has a rectangular shape when viewed from above, but the present invention is not limited thereto.

The image sensor 200 according to the embodiment of the present invention is a direct conversion-type X-ray detector, in which the incident X-rays are directly converted into an electrical signal.

With reference to FIGS. 1 to 3, the image sensor 200 may include a plurality of pixel regions P, which are disposed in the form of a matrix comprising rows and columns.

Each of the plurality of pixel regions P may be configured such that a photoelectric converter (PC) for converting X-rays into an electrical signal is formed on a substrate 210.

Examples of the substrate 210 for use in the image sensor 200 may include, but are not limited to, CMOS, a glass substrate, a graphite substrate, and a substrate configured such that ITO is formed on an aluminum oxide ($Al_2O_3$) base.

Formed on the surface of the substrate 210 is a protective film 215. The protective film 215 may be formed of an inorganic insulating material, for example, silicon oxide ($SiO_2$) or silicon nitride ($SiN_x$).

The protective film 215 may include a hole 217 for each pixel region P. A front electrode 220 may be provided in the hole 217. The front electrode 220 may be formed of, for example, aluminum (Al), copper (Cu), or an Al—Cu alloy.

The front electrode 220 is an electrode for a photoelectric converter (PC), for example, a first electrode.

The buffer layer 230 is formed on the substrate 210 having the front electrode 220. The buffer layer 230 may be formed of, for example, CdS or ZnTe. The buffer layer 230 is preferably formed to a thickness of about 1 to 5 μm.

The buffer layer 230 may be formed for each pixel region P, or may be formed on at least a portion of the plurality of pixel regions P for the image sensor 200, but the present invention is not limited thereto.

The buffer layer 230 may be deposited using a variety of processes, for example, vacuum deposition, sputtering, chemical vapor deposition, pyrolysis, and CBD (Chemical Bath Deposition).

The buffer layer 230 is interposed between the photoconductive layer 240 and the front electrode 220 so as to increase the strength of adhesion between the photoconductive layer 240 and the front electrode 220.

The photoconductive layer 240, which is formed of a semiconductor material having high atomic weight, such as CdTe, CdZnTe, PbO, $PbI_2$, $HgI_2$, GaAs, Se, TlBr, or $BiI_3$, and particularly a photoconductive layer 240 made of Cd(Zn)Te, may exhibit poor adhesion to the front electrode 220, which is made of Al. Therefore, a buffer layer 230, characterized by high strength of adhesion to the front electrode 220, is provided between the photoconductive layer 240 and the front electrode 220, thereby increasing the strength of adhesion of the photoconductive layer 240 to the front electrode 220.

As mentioned above, the photoconductive layer 240 may be formed by depositing a semiconductor material having high atomic weight on the buffer layer 230. When X-rays are incident on the photoconductive layer 240, electron-hole pairs are generated, thus producing an electrical signal.

The photoconductive layer 240 may be deposited using a variety of processes, such as sputtering, vacuum deposition, electroplating, spraying, screen printing, MOCVD, close-spaced sublimation, and VTD (Vapor Transport Deposition).

A rear electrode 250, which functions as a second electrode for the photoelectric converter (PC), may be formed on the photoconductive layer 240. The rear electrode 250 may be formed of a metal material, for example, gold (Au), but the present invention is not limited thereto. The rear electrode 250 may be provided in the form of a dot or a layer, as in the front electrode, but the present invention is not limited thereto.

As described hereinbefore, according to embodiments of the present invention, a buffer layer having high strength of adhesion to the front electrode, compared to the photoconductive layer, is provided between the photoconductive layer, which is made of a semiconductor material having high atomic weight, such as Cd(Zn)Te, and the front electrode, which is made of Al. Thereby, the strength of adhesion between the photoconductor and the front electrode may be enhanced.

Also, the buffer layer in the present invention is mainly described as being embodied in an image sensor, but the corresponding structure may be applied to photoelectric converters for other purposes, such as solar cells.

The invention claimed is:

1. An image sensor, comprising:
   a protective layer formed on a substrate and having at least one hole;
   a first electrode formed in the at least one hole of the protective layer and comprising aluminum, copper or an aluminum-copper alloy on a substrate;
   a buffer layer formed on the protective layer and the first electrode;
   a photoconductive layer formed on the buffer layer; and
   a second electrode formed on the photoconductive layer,
   wherein the buffer layer comprises CdS or ZnTe and adheres the first electrode and the photoconductive layer.

2. The image sensor of claim 1, wherein the photoconductive layer comprises CdTe, CdZnTe, PbO, $PbI_2$, $HgI_2$, GaAs, Se, TlBr or $BiI_3$.

3. The image sensor of claim 1, wherein the buffer layer has a thickness of 1 to 5 μm.

4. The image sensor of claim 1, wherein the buffer layer is formed on at least a portion of a plurality of pixel regions for the image sensor.

5. The image sensor of claim 1, wherein the image sensor is an image sensor for detecting X-rays.

6. A method of manufacturing an image sensor, comprising:
   forming a protectively layer having at least one hole on a substrate;
   forming a first electrode in the at least one hole of the protective layer and comprising aluminum, copper or an aluminum-copper alloy on a substrate;
   forming a buffer layer on the protective layer and the first electrode;
   forming a photoconductive layer on the buffer layer; and
   forming a second electrode on the photoconductive layer,
   wherein the buffer layer comprises-CdS or ZnTe and adheres the first electrode and the photoconductive layer.

7. The method of claim 6, wherein the photoconductive layer comprises CdTe, CdZnTe, PbO, $PbI_2$, $HgI_2$, GaAs, Se, TlBr or $BiI_3$.

8. The method of claim 6, wherein the buffer layer has a thickness of 1 to 5 μm.

9. The method of claim 6, wherein the buffer layer is formed on at least a portion of a plurality of pixel regions for the image sensor.

10. The method of claim 6, wherein the image sensor is an image sensor for detecting X-rays.

* * * * *